United States Patent [19]

Shimoji

[11] Patent Number: 5,349,222

[45] Date of Patent: Sep. 20, 1994

[54] SINGLE GATE MOS TYPE NONVOLATILE MEMORY AND OPERATING METHOD THEREOF

[75] Inventor: Noriyuki Shimoji, Kyoto, Japan

[73] Assignee: Rohm Co., Ltd., Kyoto, Japan

[21] Appl. No.: 12,882

[22] Filed: Feb. 3, 1993

[30] Foreign Application Priority Data

Feb. 19, 1992 [JP] Japan ................................ 4-032164

[51] Int. Cl.$^5$ ............................................. H01L 29/78
[52] U.S. Cl. ................................. 257/326; 257/324; 257/316; 365/184
[58] Field of Search ................. 257/326, 324, 316; 365/184, 104

[56] References Cited

U.S. PATENT DOCUMENTS

| | | | |
|---|---|---|---|
| 4,651,186 | 3/1987 | Yamamoto et al. | 257/326 |
| 4,725,986 | 2/1988 | Kouba | 365/104 |
| 5,172,199 | 12/1992 | Yamauchi et al. | 257/306 |

*Primary Examiner*—Robert Limanek
*Attorney, Agent, or Firm*—Thomas R. Morrison

[57] ABSTRACT

The present invention provides nonvolatile semiconductor memory which has advantages permitting the cell of the memory circuit to integrate, the memory circuit to be easy to manufacture, and the manufacturing expense to be cut down. The nonvolatile memory (21) comprises a P type well (2) for which a N+ type source (4) and a N+ type drain (3) is provided. A surface of a space between the source (4) and the drain (3) comprises a first portion (10a) and a second portion (10b). An insulating layer (6) for holding electrons spans the surface of the first portion (10a). A memory gate electrode (5) is on the insulating layer (6) and spans the first portion (10a). A conductive body 23 is provided on an insulating layer (8) so that it spans the second portion (10b) and is electrically disconnected from the memory gate electrode (5).

13 Claims, 7 Drawing Sheets

| mode | selected memory | X1 | X2 | W1 | W2 | B1 | B2 | PW |
|---|---|---|---|---|---|---|---|---|
| writing | C11 | −4 | −4 | 5 | −4 | −4 | 5 | −4 |
| erasing | C11,12 | −4 | −4 | −4 | 5 | 5 | 5 | 5 |
| reading | C11 | 5 | 0 | 0 | 0 | SA | OPEN | 0 |

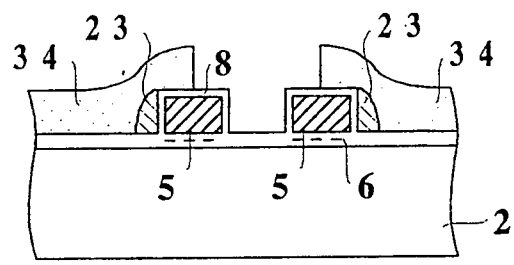
F I G. 6 A
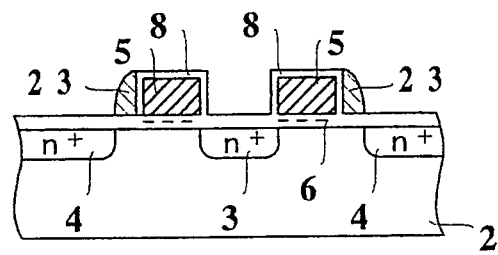
F I G. 6 B
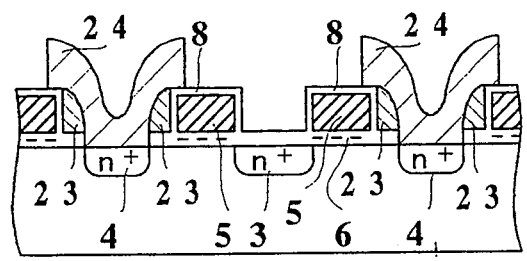
F I G. 6 C
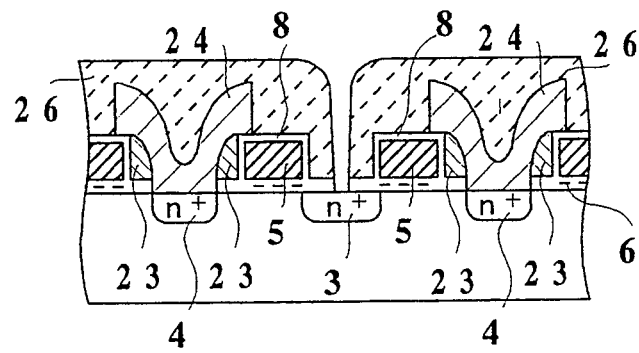
F I G. 6 D

|  | BL1 | BL2 | WL1 | WL2 | S1 | PW |
|---|---|---|---|---|---|---|
| writing | 0 | 7 | 10 | 0 | 0 | 0 |
| erasing | OPEN | OPEN | 0 | 10 | OPEN | 10 |
| reading | 0 | OPEN | 5 | 0 | 2 | 0 |

SINGLE GATE MOS TYPE NONVOLATILE MEMORY AND OPERATING METHOD THEREOF

BACKGROUND OF THE INVENTION

1. Field of the Invention

The present invention relates to a semiconductor nonvolatile memory and, more particularly, to improvements in integration, speed of operation and productivity thereof.

2. Description of the Prior Art

A semiconductor nonvolatile memory 1 as shown in FIG. 1(a) and 1(b). Referring to FIG. 1, a P type well 2 includes a drain 3 and a source 4, and two regions form a space comprising of a region 10a and a region 10b. Between the region 10a and a memory gate electrode 5 is an insulating layer 6 for trapping electrons. This insulating layer 6 has a three layered structure: a silicon dioxide layer 6a, a silicon nitride layer 6b, a silicon dioxide layer 6c. The silicon nitride layer 6b traps electrons by bias between the well 2 and the memory gate electrode 5. The insulating layer 6 and a silicon dioxide layer 8 insulate a control gate electrode 7 from both the memory gate electrode 5 and the region 10b.

Region 10b changes from nonconductive to conductive when a stable positive voltage is applied to the control gate electrode 7 and the region 10a changes from conductive to nonconductive when a stable positive voltage is applied to the memory gate electrode 5.

Next the operations of writing data to and reading data from the nonvolatile memory 1 will be described. To write data onto the memory 1, a positive voltage such as 9 V is applied to the memory gate electrode 5 relative to the drain 3 and the source 4, whereby electrons moves from the P type well 2 and becomes trapped in the insulating layer 6. This change in charge distribution due to the trapped electrons cause the region 10a to change from conductive to nonconductive. These electrons remain trapped in the insulating layer 6 even when the voltage applied to the memory gate electrode 5 is cut off. This state of trapped electrons is referred to as "write state" hereinafter.

To read data from memory device 1, a positive voltage, which is larger than the threshold voltage for the conductive channel of the region 10b, is applied to the control gate electrode 7 relative to the drain 3 and the source 4, whereby the region 10b changes from nonconductive into conductive.

Therefore, when the insulating layer 6 has no electrons trapped therein and a voltage is applied to the drain 3 relative to the source 4, a current flows between the drain 3 and the source 4 because the regions 10a and 10b are conductive. Conversely, when the insulating layer 6 has electron trapped therein and a voltage is applied to the drain 3 relative to the source 4, no current flows between the drain 3 and the source 4 because the region 10a is nonconductive.

As is described above, it can be determined whether or not the memory 1 is in "write state", by determining whether or not a current flows between the drain 3 and the source 4.

To erase data from the nonvolatile memory, a positive voltage is applied to the P type well 2 relative to the memory gate electrode 5. This application of the voltage causes the electrons trapped in the insulating layer 6 to return the well 2.

A memory circuit can be constructed by using the above-mentioned memories 1 in an array of rows and columns. The memory circuit is shown in a partial view equivalent circuit 15 in FIG. 2A. As shown in FIG. 2A, each word line W connects with all control memory gate electrodes of memories arrayed in a columns and each word line X connects with all control gate electrodes of memories arrayed in a column and each bit line connects with all memory drain arrayed in a row and a well line PW connects with sources of all of the memories arrayed in rows and columns as well as wells for each of them.

So as not to write data onto and read data from all but a desired memory, the following means can select a desired memory from the memory circuit.

FIG. 2B is a table showing an example of combinations of voltages applied to each of the individual lines at writing, erasing and reading operations. The combinations enable the memory circuit to select a desired memory, for example, a memory C11 at writing and reading operations.

More specifically, to write data onto the selected memory C11, a voltage of 5 V is applied to both the word line W1 and the bit line B2 and a voltage of −4 V is applied to each of the other individual lines. This means that a positive voltage of 9 V (volts) is applied to the memory gate electrode 5 of the selected memory C11 relative to the well 2, the source 4 and the drain 3. As a result of this application, the electrons get trapped in insulating layer 6 of the selected memory C11.

Referring to the nonselected memory C12, the voltage of 5 V is applied to the memory gate electrode 5 and thereby making the region 10a conductive. The voltage of 5 V applied to the drain 3 can travel into the region 10a. That is, there is no potential difference between the memory gate electrode 5 and the well 2. Therefore, the insulating layer 6 of the nonselected memory C12 gets no electrons trapped therein. Referring to the other nonselected memories C13 and C14, −4 V is applied to the memory gate electrode 5. Therefore, the insulating layer 6 gets no electrons trapped therein, respectively.

Note that the voltage of −4 V is applied to the word lines X1 and X2 in order that all the regions 10b of memories C11, C12, C13 and C14 get nonconductive. Therefore, the voltage of 5 V applied to the bit line B2 can travel into the region 10a of the memory C12 without a loss.

Reading operation is effected by applying a voltage of 5 V to a word line X1, applying a positive voltage to the bit line B1 which connects to a sense amplifier, leaving the bit line B2 floating and applying a voltage of 0 V to each of the other individual lines.

Referring to the selected memory C11, the region 10b is conductive because the voltage of 5 V is applied to the control gate electrode 7. When the memory C11 has electrons trapped in the insulating layer 6 the region 10a is nonconductive. Therefore, no current flows through the bit line B1. Conversely, when the memory C11 has no electrons trapped in the insulating layer 6 the region 10a is conductive. Therefore, a current flows through the bit line B1.

Referring to the nonselected memory C12, the region 10b is conductive because 5 V is applied to the control gate electrode 7. However, since the source 4 has 0 V applied and the bit line B2 is left floating, no current flows through the bit line B2 even when the region 10a is conductive. Referring to the other nonselected memories C13 and C14, the region 10b is nonconductive because 0 V is applied at word line X2. Therefore, no current flows through the bit line B1 and through the bit line B2 respectively.

As described above, data can be written onto and read from a desired memory.

Meanwhile, the erasing operation is effected by applying a voltage of −4 V to word line X1, word line X2, word line W1, and applying a voltage of 5 V to the other individual lines.

Referring to the selected memory C11 and C12, since 5 V is applied to the well line PW and 4 V is applied memory gate electrode 5, the electric field developed between the well 2 and the memory gate electrode 5 moves electrons in the insulating layer 6 to the well 2. This erases the data in memories C11 and C12.

Referring to the nonselected memories C13 and C14, since 5 V is applied to the well 2 and the memory gate electrode 5, no electric field is developed between the well 2 and the memory gate electrode 5. Therefore, the data in memories C13 and C14 are left unchanged.

The above-mentioned memory circuit, however, has the following problem.

Each memory in the memory circuit comprises two field effect transistors with a common source and the common drain.

These two field effect transistors bar the memory cell and the memory circuit from integrating and being manufactured easily.

Meanwhile, in order to control the conductivity of the region 10b by application of an electric field between the well 2 and the control gate electrode 7, it is necessary that region 10b have a certain width after the manufacturing process. This width W is determined by a width of a photoresist pattern used as a mask. In lithography, it is difficult to meet the photoresist pattern mask to a predetermined position in the substrate. Therefore, it is difficult to arrange the region 10b with a predetermined width.

SUMMARY OF THE INVENTION

Accordingly, it is an object of the present invention to provide nonvolatile semiconductor memory that comprises one-transistor cells and that has advantages in integrating the cell and in minimizing down the manufacturing expense.

A semiconductor device including nonvolatile memories according to one embodiment of the present invention comprises:

a) a substrate of semiconductor, b) a first region formed in the surface of the substrate, c) a second region formed in the surface of the substrate and defining a space between the first region and the second region, the surface of the space comprising a first portion and a second portion, d) an insulating layer for holding electrons spanning the first portion, e) an insulating layer spanning the second portion, f) a control electrode being on the insulating layer for holding electrons and spanning the first portion, and g) a conductive body which is on the insulating layer and spans the second portion and is electrically disconnected from the control electrode.

A method for manufacturing a semiconductor device including nonvolatile memories according to one embodiment of the present invention comprises the steps of:

a) preparing a substrate of semiconductor, b) depositing an insulating layer for holding electrons on the surface of the substrate, c) covering the surface of the insulating layer for holding electrons with a control electrode wherein a portion of the surface of the substrate spanned by the control electrode is defined as a first portion, d) forming a conductive body above the substrate so that the conductive body is adjacent to the control electrode and insulated from the control electrode wherein a portion of the surface of the substrate spanned by the conductive body is defined as a second portion, and e) implanting a dopant into the substrate using both the conductive body and the control electrode as a mask so that a first region and a second region are created in the substrate, A method for operating memories, which comprise a substrate of semiconductor, a source formed in the surface of the substrate, a drain formed in the surface of the substrate and defining a space between the source and the drain, the surface of the space comprising a first portion and a second portion, an insulating layer for holding electrons spanning the first portion, an insulating layer spanning the second portion, a memory gate electrode being on the insulating layer for holding electrons and spanning the first portion, and a conductive body which is on the insulating layer and spans the second portion and is electrically disconnected from the memory gate electrode, according to one embodiment of the present invention comprises steps of:

a) arraying the memories in rows and columns, b) connecting each of drain lines to all the drains of the memories arrayed in a row, c) connecting each of gate lines to all the memory gate electrodes of the memories arrayed in a column, d) connecting a source line to the sources of all the memories arrayed in lows and columns, e) writing data into a desired memory, applying a programming voltage to the gate line connecting with the desired memory and applying a voltage to the drains of the undesired memories in order not to write data into the undesired memories, and f) reading data from a desired memory, determining whether or not a current flows through a drain line connecting to the drain of the desired memory when a sense voltage is applied to a gate line connecting with the memory gate electrode of the desired memory as well as applying a reading voltage to the source line.

The above, and other objects, features and advantages of the present invention will become apparent from the following description read in conjunction with the accompanying drawings, in which like reference numerals designate the same elements.

BRIEF DESCRIPTION OF THE DRAWINGS

FIGS. 6A through 6D are views showing the manufacturing process of the memory circuit.

DETAILED DESCRIPTION OF THE INVENTION

An embodiment according to the present invention will be described with reference to the figures.

Figure 1:
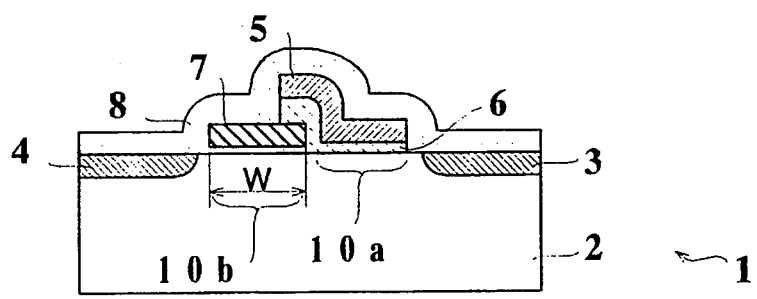
FIG. 1(a) is a sectional view showing schematically a nonvolatile memory 1 according to related art.
FIG. 1(b) is an exploded view of an identified section as shown in FIG. 1(a).
Figure 1:
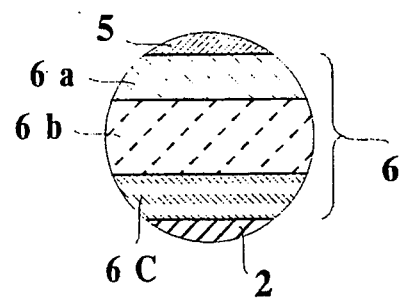
Figures 2A, 2B:
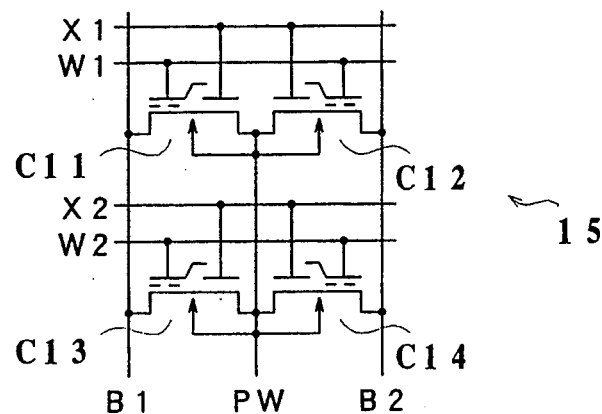
FIG. 2A is a conceptual view showing a memory circuit constructed by using the nonvolatile memory 1 and FIG. 2B is a table showing an example of combinations of voltages applied to each of the individual lines at erasing, writing and reading operation.
Figure 3:
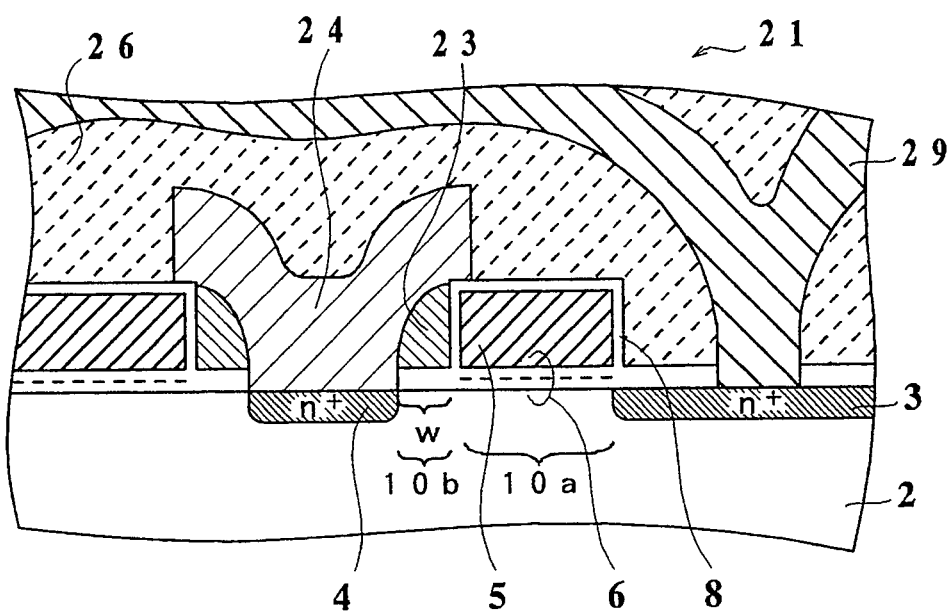
FIG. 3 is a sectional view showing schematically a nonvolatile memory according to one embodiment of the present invention.

FIG. 3 shows a nonvolatile memory 21 according to the embodiment of the present invention. Referring to FIG. 3, the nonvolatile memory 21 is comprised of a substrate of semiconductor in which a P type well 2 is formed, a source 4 of a first region and a drain 3 of a second region is disposed on the surface of the well 2. Both the source 4 and the drain 3 are diffusion layers of N+ type conductivity. A surface of a space between the source 4 and the drain 3 comprises a first portion 10a and a second portion 10b, the conductivity of which can be controlled by application of an electric field.

An insulating layer 6 for holding electrons spans the first portion 10a and has a three layered structure layer: a silicon dioxide layer 6a, a silicon nitride layer 6b, and a silicon dioxide layer 6c, as mentioned in Description of the Prior Art. The silicon nitride layer 6c is where electrons can be trapped by applying a bias in the insulating layer 6. A memory gate electrode 5 of a control electrode is on the insulating layer 6 and spans the first portion 10a. A conductive body 23 is on an insulating layer 8 and spans the second portion 10b. Note that the conductive body 23 is electrically insulated from the memory gate electrode 5 via the insulating layer 8. Although in this embodiment the conductive body 23 is connected directly to the insulating layer 8, in another embodiment the conductive body 23 may be connected to the insulating layer 8 via any other layer. Therefore, in the embodiment according to the present invention "on" means both cases.

A source electrode 24 of a first region electrode is attached to the source 4 and is connected to the conductive body 23. The insulating layer 8 insulates the memory gate electrode 5 from the source electrode 24. An insulating layer 26 covers the surface of the memory gate electrode 5 and the surface of the source electrode 24. On the layer 26 is a bit line of aluminum connecting to all drains arrayed in a row (not shown).

Figures 7A, 7B:
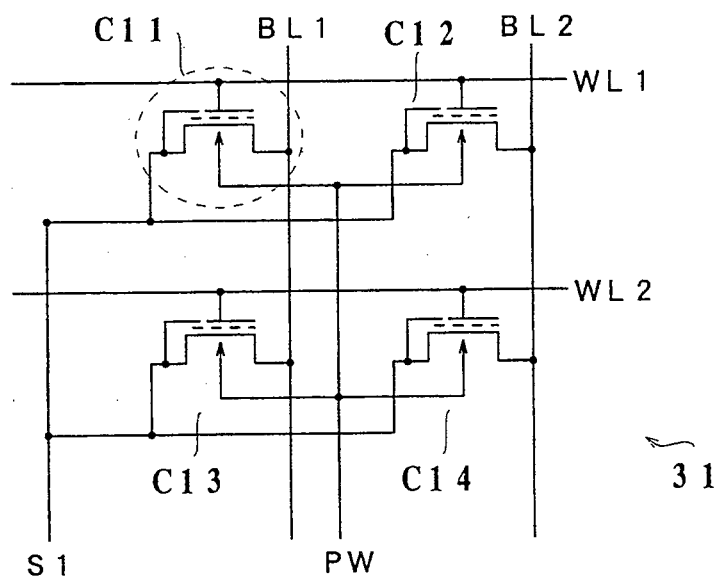
FIG. 7A is a conceptual view showing a memory circuit constructed by using the nonvolatile memory 21 and FIG. 7B is a table showing an example of combinations of voltages applied to each of the individual lines at erasing, writing and reading operation.

A memory circuit 31 can be composed of the above-mentioned memories 21 which are in and array of rows and columns. Referring to FIG. 7A, the memory circuit 31 is shown in partial view of equivalent circuit in FIG. 7A. As shown in FIG. 7A, each of the word lines WL of the gate lines connects with all the memory gate electrodes of the memories arrayed in a column, each of the bit lines BL of the drain lines connects with all the memory drains arrayed in a row, a source line S1 connects with all the memory sources arrayed in rows and columns and a memory well is line PW connects with all the well arrayed in rows and columns.

So as not to write data onto and read from all memories but the desired memory, the following means is used to select the desired memory from the memory circuit.

FIG. 7B is a table showing the combinations of voltages applied to each of the individual lines at erasing, writing and reading operations. The combination enables the memory circuit to select a desired memory, for example, a memory C11 at the writing and reading operations.

More specifically, to write data into the selected memory C11, a "programming voltage" of 10 V is applied to the word line WL1, a voltage of 7 V is applied to the bit line BL2 and a voltage of 0 V is applied to the other individual lines.

Returning to FIG. 7A and referring to the selected memory C11, the memory gate electrode 5 has a positive potential relative to all of the well 2, the source 4 and the drain 3, and thereby electrons in the well 2 get trapped in the insulating layer 6.

Note that "programming voltage" is a voltage applied to the memory gate electrode 5 relative to all of the well 2, the source 4 and the drain 3 whereby electrons in the well 2 move to the insulating layer 6 and get trapped therein.

Referring to the nonselected memory C12, the first portion 10a is conductive because the voltage of 10 V is applied to the memory gate electrode 5. Therefore, as 7 V is applied to the drain 3, 7 V is applied at the first portion 10a. At that time, there is not produced a potential difference between the memory gate electrode 5 and the well 2 enough to trap electrons in the insulating layer 6.

Referring to the other nonselected memory C13 and C14, the insulating layer 6 gets no electrons trapped therein because a voltage of 0 V is applied to the memory gate electrode 5 relative to the well 2.

Note that the second portion 10b of memories C12 and C14 remain nonconductive because 0 V is applied to the source line S1. Therefore, the 7 V applied to the bit line BL2 can travel in the first portion 10a of the memory C12 without a loss.

The reading operation is effected by applying a "sense voltage" of 5 V to the word line WL1, applying a "reading voltage" of 2 V to the source line S1, leaving the bit line BL2 floating and applying 0 V to each of the other individual lines.

Note that the "sense voltage" lies between a minimum voltage applied to the memory gate electrode 5 relative to the well 2, such that the first portion 10a can change from nonconductive into conductive when the insulating layer 6 has no electrons trapped therein, and such a minimum voltage applied to the memory gate electrode 5 relative to the well 2, such that the first portion 10a changes from nonconductive into conductive when the insulating layer 6 has electrons trapped therein.

Therefore, when electrons are not trapped in the insulating layer 6 and the sense voltage is applied to the memory gate electrode 5, the first portion 10a changes from being nonconductive. Meanwhile, when electrons are trapped in the insulating layer 6 and the sense voltage is applied to the memory gate electrode 5, the first portion 10a changes from nonconductive to conductive.

Note that when "reading voltage" is applied to the source 4 the second portion 10b changes from nonconductive into conductive without breaking down the insulation of the PN junction between the source and the well, and the drain and the well.

Returning to FIG. 7A and referring to the selected memory C11, the second portion 10b is conductive because the reading voltage of 2 V is applied to the source line S1 (see FIG. 3). When the insulating layer 6 has to electrons trapped therein, even when the sense voltage of 5 V is applied to the word line WL1, the first portion 10a changes from being nonconductive. Therefore, no current flows between the source 4 and the drain 3. Conversely, when the insulating layer 6 has no electrons trapped therein and the sense voltage of 5 V is applied to the word line WL1, the first portion 10a changes to conductive. Therefore, a current flows between the source 4 and the drain 3.

Referring to the nonselected memory C12, the second portion 10b is conductive because the reading voltage of 2 V is applied to the source line S1. The bit line BL2 is left floating. Therefore, no current flows between the source 4 and the drain 3 even when the first portion 10a is conductive. Referring to the nonselected memory C13 and C14, because the word line WL2 has 0 V applied thereto and the second portion 10b is nonconductive, no current flows between the source 4 and the drain 3.

At that time, the sense amplifier (not shown) connected to the bit line BL1 knows if a current flows through the bit line BL1.

As is described above, data can be written onto and read from a desired memory.

Meanwhile, erasing operation is effected by applying of 10 V to both the well line PW and the word line WL2, applying 0 V to the word line WL1, and leaving the bit lines BL1 and BL2, and the source line S1 floating.

Referring to the selected memories C11 and C12, since the well line PW has 10 V applied thereto and the memory gate electrode 5 has 0 V applied thereto, the electric field developed between the well 2 and the memory gate electrode 5 moves electrons from the insulating layer 6 to the well 2. This means the data has been erased.

Referring to the nonselected memories C13 and C14, since the well 2 has 10 V applied thereto and the memory gate electrode 5 have the voltage of 10 V, no electric field develops between the well 2 and the memory gate electrode 5. Therefore, the data is left unchanged.

Note that when 10 V is applied to both the word line WL1 and the word line WL2 data can be erased from all of the memories at the same time.

In above-described memories 21, a layer 8 of silicon dioxide is used as insulator between the second portion 10b and the conductive body 23.

The manufacturing process for the memory circuit constructed using the memory cells 21 will be described below.

Figure 4A:
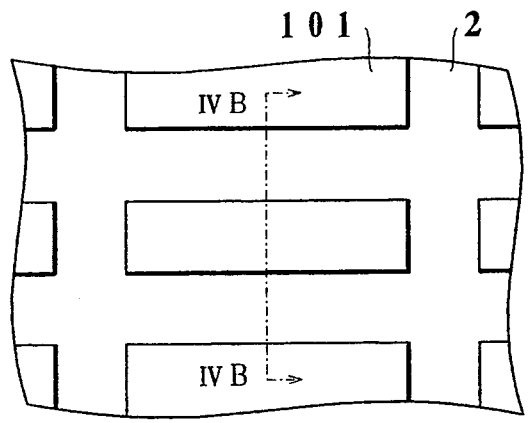
FIGS. 4A through 4F are views showing the manufacturing process of the memory circuit.
Figure 4B:
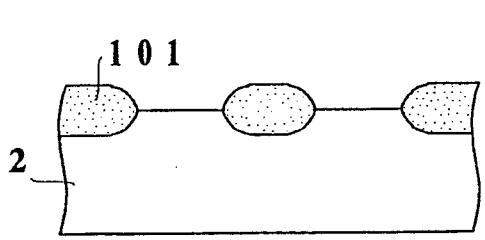

Referring to FIG. 4A, field oxide layers are formed in a well 2 in a substrate of semiconductor by Local Oxidation of Silicon (LOCOS) technique to divide the substrate into insulated islands. Note that FIG. 4B is a IVB—IVB sectional view to FIG. 4A. In the embodiment, the depth of the field oxide layer is 600 nm.

Figure 4C:
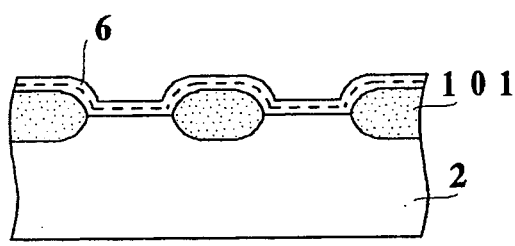

After cleaning the substrate, a 2 nm thick layer of silicon dioxide is formed on the substrate by partial oxidation. A 10 nm thick layer of silicon nitride layer is deposited on top of the silicon dioxide layer by Low pressure CVD (chemical vapor deposition) technique. A 5 nm thick layer of silicon dioxide is formed on the silicon nitride by wet oxidation technique. As shown in FIG. 4C, an insulating layer for holding electrons is comprised of the above three layered structure.

Figure 4D:
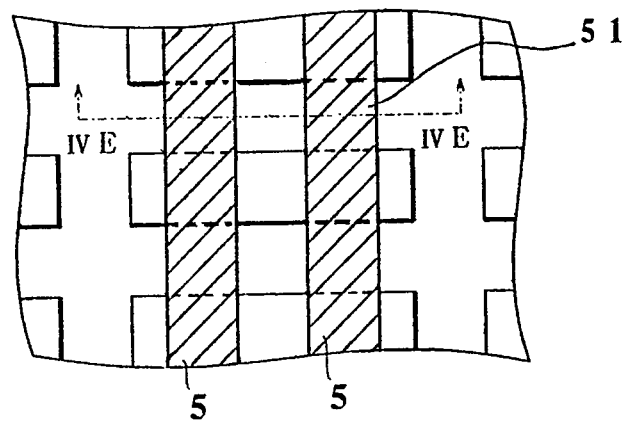
Figure 4E:
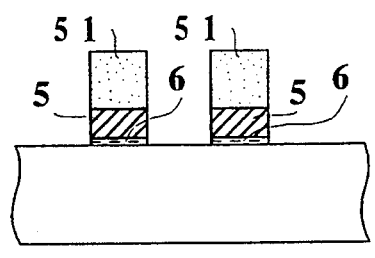
Figure 4F:
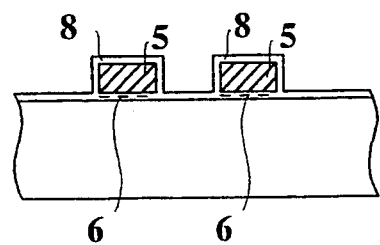

Thereafter, referring to FIG. 4D, layer of polysilicon is deposited on top of the insulating layer 6 and a photoresist pattern 51 is formed on the polysilicon layer so that a memory gate electrode 5 can be formed by etching using the photoresist pattern 51 as a mask. This removes the unwanted portion of the insulating layer 6. After removing the resist pattern 51, the resulting substrate is subjected to a wet oxidation step to deposit an insulating layer 8 on both the exposed face of the substrate and on the surface of the memory gate electrode 5 as shown in FIG. 4F. Note that FIG. 4F is a IVF—IVF sectional view to FIG. 4E.

Figure 5A:
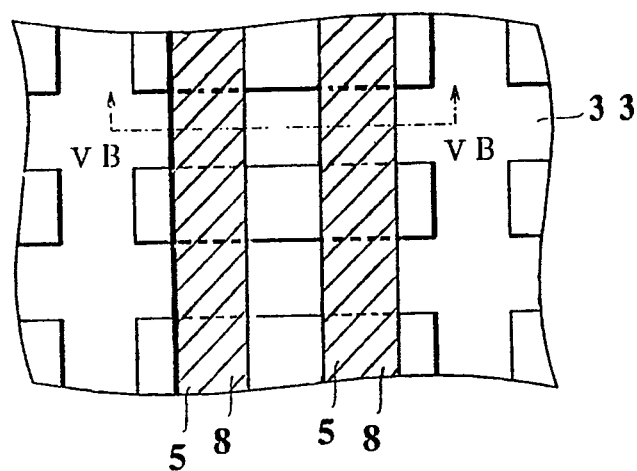
FIGS. 5A through 5D are views showing the manufacturing process of the memory circuit.
Figure 5B:
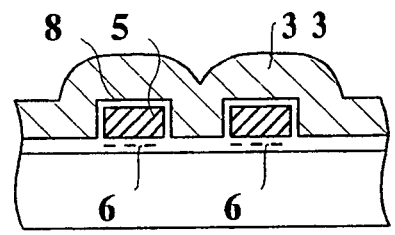
Figure 5C:
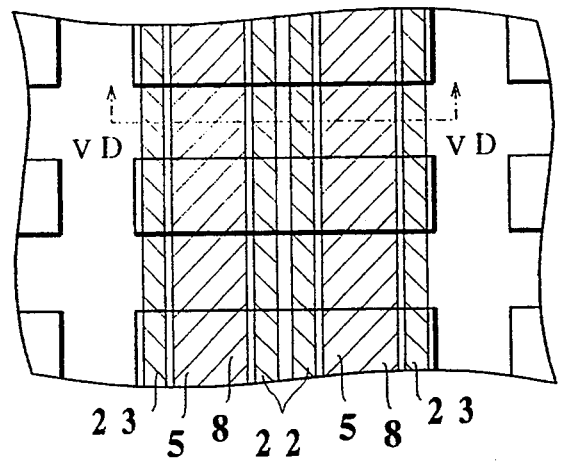
Figure 5D:
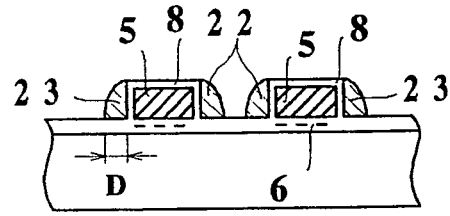

Referring to FIGS. 5A and 5B, a layer 33 of polysilicon is formed on the resulting substrate. Note that FIG. 5A is a VA—VA sectional view to FIG. 5B. Thereafter, the resulting substrate is subjected to an anisotropic etching technique such as reactive ion etching (RIE). Thereby conductive bodies 22 and 23 of polysilicon are formed on the insulating layer 8 such so that they are adjacent to both sides of the memory gate electrode 5. FIG. 5C is a VC—VC sectional view to FIG. 5D.

Note that isotropic etching is a technique of etching in both the lateral direction and the vertical direction while anisotropic etching is a technique of etching in only the vertical direction.

Reactive ion etching may continue until the surface of the insulating layer 6 is exposed. But reactive ion etching may continue until the portion of the insulating layer 6 is removed. This is because reactive ion etching is the technique of etching in only the vertical direction and at that time have little influence on the width of the conductive body. In other word, the width D of the conductive body can be controlled easily. Therefore, the width of the region 10b can be controlled easily.

Specifically, the width D of the conductive body 23 is determined by the thickness of the layer 33. Furthermore, the thickness of the layer 33 can be controlled correctly.

Referring to FIG. 6A, after the conductive bodies 23 on one side of the memory gate electrode 5 are covered with a photoresist mask, the conductive bodies 22 on the other side of the memory gate electrode 5 are removed by etching technique.

Referring to FIG. 6B, after the photoresist mask is removed, the substrate is subjected to an ion implantation step, whereby sources 4 and drains 3 of N+ type diffusion layers are formed in the well 2.

Referring to FIG. 6C, a layer of polycide is deposited on the entire surface of the substrate and formed onto a source electrode 24 by etching using a photoresist pattern as a mask.

Referring to FIG. 6D, a layer 26 of silicon dioxide is provided for the top of the resulting substrate. After an opening is made, such that an electrode can be attached to drain 3 in the layer 26 and a layer of Aluminum silicon is deposited on top of the resulting substrate, the layer forms into bit lines 29 which are drain lines created by etching using a photoresist pattern as a mask (see FIG. 3).

At last, a layer (not shown) of passivation is formed on the entire substrate.

Although in the preferred embodiment the conductive body 23 connects with the source electrode 24, in the alternative embodiments a silicon oxide layer may insulate the conductive body 23 from the source electrode 24 and a control electrode may be provided for the conductive body 23.

A memory of the alternative embodiments may be manufactured as follows. In the above-mentioned manufacturing method, before the insulating layer 26 of silicon dioxide is deposited by CVD an insulating layer of silicon dioxide is deposited on the entire surface of the resulting substrate and an opening is created in the insulating layer so as to expose the surface of the conductive bodies 23. A layer of polycide is then deposited on the entire surface of the substrate and formed into a control electrode for the conductive bodies 23 by etching using a photoresist pattern as a mask.

Although in the preferred embodiment the insulating layer 6 of the memory is comprised of the silicon dioxide layer 6a, the silicon nitride layer 6b and the silicon dioxide layer 6c, in alternative embodiments an insulating layer may be comprised of a silicon dioxide layer and a silicon nitride layer and also may comprise any one of layers provided that the layer can hold electrons during a writing operation.

Although in the preferred embodiment the conductive body 23 is made of polysilicon, in the alternative embodiments the conductive body is formed by using tungsten cilicide or any other one of conductive materials provided that it can be reactive ion etched.

Although in the preferred embodiment the source 4 and the drain 3 are semiconductors of N+ type and the first portion 10a and the second portion 10b are semiconductors of P type, in alternative embodiments the two regions may also be semiconductors of P type and the two portions may be semiconductor of N+ type.

Therefore, the memory circuit and manufacturing method according to the present invention is characterized in that it is easy to control the length of the second portion 10b and in that the second portion 10b can change from nonconductive into conductive when the reading voltage is applied to the source electrode 24. Therefore, the second portion 10b can be used as a switch. This fact permits the memory circuit to be constructed using the one-transistor cell. That is, a present invention can provide the memory circuit which has the advantages of integration manufacturing expense and manufacturing ease, as compared with the memory circuit constructed using a two-transistor cell.

The method for operating the memory circuit according to the present invention is characterized in that data is able to be written onto and read from a desired memory cell in the memory circuit without mistakes. As a result of this, compared with the memory circuit constructed using a two-transistor cell, the above-mentioned memory circuit has advantages in integrating the memory circuit as well as its memory cell, and in cutting down the manufacturing expense.

Although the present invention has been fully described by way of examples with reference to the accompanying drawings, it is to be noted that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including nonvolatile memories comprising:
    a substrate of semiconductor;
    a first region formed in the surface of the substrate;
    a second region formed in the surface of the substrate and defining a space between the first region and the second region, the surface of the space comprising a first portion and a second portion;
    an insulating layer for holding electrons spanning the first portion;
    an insulating layer spanning the second portion;
    a control electrode on the insulating layer, spanning the first portion, and having a side surface;
    a conductive body, on the insulating layer, spanning the second portion, and lying adjacent to the side surface of the control electrode;
    the conductive body being electrically isolated from the control electrode; and
    a first region electrode contacting the first region and the conductive body.

2. A semiconductor device including nonvolatile memories according to claim 1, wherein the conductive body has a height which is substantially the same as a height of the control electrode, and a width smaller than the height.

3. A semiconductor device including nonvolatile memories according to claim 1, wherein the conductive body is formed by anisotropic etching of a conductive layer provided on an entire surface of the substrate.

4. A semiconductor device including nonvolatile memories according to claim 1,
    wherein the insulating layer for holding electrons comprises a silicon dioxide layer, a silicon nitride layer on the silicon layer and a silicon dioxide layer on the silicon nitride layer.

5. A semiconductor device including nonvolatile memories according to claim 1,
    wherein the insulating layer for holding electrons comprises a silicon dioxide layer and a silicon nitride layer on the silicon dioxide layer.

6. A semiconductor device including nonvolatile memories according to claim 1,
    wherein the first region and the second region are made of semiconductor of P type conductivity and the first portion and the second portion are made of semiconductor of N type conductivity.

7. A semiconductor device including nonvolatile memories according to claim 1,
    wherein the first region and the second region are made of semiconductor of N type conductivity and the first portion and the second portion are made of semiconductor of P type conductivity.

8. A semiconductor device including nonvolatile memories according to claim 1,
    wherein the first region is a source, the second region is a drain, and the control electrode is a memory gate electrode.

9. A method for operating memories of claim 8 comprising:
    arraying the memories in rows and columns;
    connecting drain lines to the drains of the memories arrayed in each of said rows;
    connecting gate lines to the memory gate electrodes of the memories arrayed in each of said columns;
    connecting a source lien to the sources of all the memories arrayed in said rows and columns; and
    to write data into a desired memory, applying a programming voltage to the gate lien connecting with the desired memory and applying a voltage to the drains of the undesired memories in order not to write data into the undesired memories, and reading data from a selected memory by determining whether a current flows through a drain line connected to the drain of the selected memory when a sense voltage is applied to a gate line connected to the memory gate electrode of the selected memory as well as applying a reading voltage to the source lien wherein said reading voltage renders said second portion of said substrate conductive.

10. A method for operating the memory according to claim 9, wherein the insulating layer for holding electrons comprises a silicon dioxide layer, a silicon nitride layer on the silicon layer and a silicon dioxide layer on the silicon nitride layer.

11. A method for operating the memory according to claim 9, wherein the insulating layer for holding electrons comprises a silicon dioxide layer and a silicon nitride layer on the silicon dioxide layer.

12. A method for operating the memory according to claim 9, wherein the first region and the second region are made of semiconductor of P type conductivity and the first portion and the second portion are made of semiconductor of N type conductivity.

13. A method for operating the memory according to claim 9, wherein the first region and the second region are made of semiconductor of N type conductivity and the first portion and the second portion are made of semiconductor of P type conductivity.

* * * * *